(12) United States Patent
Chen et al.

(10) Patent No.: US 11,894,473 B2
(45) Date of Patent: Feb. 6, 2024

(54) SENSING MODULE AND MANUFACTURING METHOD THEREOF

(71) Applicant: CHIP POSITION SYSTEM CO., LTD., Hsinchu County (TW)

(72) Inventors: Ruei Chi Chen, Hsinchu (TW); Chih Lin Yang, New Taipei (TW)

(73) Assignee: Chu Hua Chang, Zhubei (TW)

(*) Notice: Subject to any disclaimer, the term of this patent is extended or adjusted under 35 U.S.C. 154(b) by 147 days.

(21) Appl. No.: 17/363,305

(22) Filed: Sep. 9, 2021

(65) Prior Publication Data

US 2023/0076715 A1 Mar. 9, 2023

(51) Int. Cl.
*H01L 31/0232* (2014.01)
*B81C 1/00* (2006.01)
*B81B 7/00* (2006.01)

(52) U.S. Cl.
CPC ...... *H01L 31/02322* (2013.01); *B81B 7/0077* (2013.01); *B81C 1/00269* (2013.01); *H01L 31/02325* (2013.01); *B81B 2201/0285* (2013.01); *B81B 2201/0292* (2013.01); *B81C 2203/0109* (2013.01); *B81C 2203/032* (2013.01)

(58) Field of Classification Search
CPC ......... H01L 31/02322; H01L 31/02325; H01L 31/0203; B81B 7/0077; B81B 2201/0292; B81B 2201/0285; B81C 1/00269; B81C 2203/0109; B81C 2203/032; G01J 1/0411; G01J 1/0271; H05B 47/11
See application file for complete search history.

(56) References Cited

U.S. PATENT DOCUMENTS

| | | | | |
|---|---|---|---|---|
| 10,522,499 | B2* | 12/2019 | Enquist | H01L 24/05 |
| 2006/0049396 | A1* | 3/2006 | Pichler | H10K 30/88 257/40 |
| 2006/0087017 | A1* | 4/2006 | Chao | H01L 31/0203 257/680 |
| 2007/0241451 | A1* | 10/2007 | Koizumi | H01L 23/147 257/E33.059 |
| 2008/0054796 | A1* | 3/2008 | Sung | H10K 59/131 313/504 |
| 2013/0001620 | A1* | 1/2013 | Sugisawa | H10K 59/131 257/E33.062 |
| 2016/0061853 | A1* | 3/2016 | Takizawa | G01D 11/245 73/511 |

FOREIGN PATENT DOCUMENTS

| TW | 200834938 A | 8/2008 |
|---|---|---|
| TW | 202107647 A | 2/2021 |

* cited by examiner

*Primary Examiner* — Yasser A Abdelaziez

(74) *Attorney, Agent, or Firm* — Rosenberg, Klein & Lee

(57) ABSTRACT

The invention relates to a sensing module and a manufacturing method thereof, which firstly provides a transparent substrate, and then a sensor, a colloid, and an optical cover body disposed on a first surface of the transparent substrate. The colloid is surrounded the encrypted chip and is connected with the transparent substrate and the optical cover. Finally, a light source irradiates the colloid through a second surface of the transparent substrate to cure the colloid for obtaining the sensing module.

10 Claims, 9 Drawing Sheets

SENSING MODULE AND MANUFACTURING METHOD THEREOF

FIELD OF THE INVENTION

This invention relates to a semiconductor device and its manufacturing method, particularly a sensing module and its manufacturing method.

BACKGROUND OF THE INVENTION

Nowadays, the Internet of Things (IoT) technology is rising and the most important technological core of IoT is environmental detection. The sensors used on environmental detection include environmental sensors, electrical sensors, magnetic sensors, and light sensors. Sensors are used in the IoT technology to capture external information for the entire IoT system, and all environmental information is to be detected, collected, and measured through the sensors. Therefore, sensors are consistently developed along with the advancement of semiconductor technology. Among the various sensors, light sensors are very important sensing elements and are frequently used in environmental monitoring systems, smart houses, smart buildings, and other IoT-related controls. The light sensors detect the light luminance in the surrounding environment; and combine the detected luminance with communication, IoT and cloud computing to provide more convenient services in life. It further integrates sensor technology in science and technology, physics and medical treatment, etc., making human life more convenient and safer.

Not only the applications in life, in the applications of portable electronic devices such as smartphones or tablets, the development of ambient light sensors is also vigorous. The ambient light sensor in the electronic device detects the brightness of the environment where the electronic device is located; meanwhile, it detects the luminance sensor that adjusts the display brightness of the electronic device or the color tint of the user interface in the electronic device relative to the environment and adjusts the color tint of the user interface in the electronic device.

In recent years, the application of wearable devices such as bracelets, smartwatches, or canal-type earphones is emerging, and the corresponding technologies have developed built-in sensors.

Furthermore, for miniature, generally, sensors are semiconductor devices made by semiconductor processes, such as the field-effect transistors (FET); particularly, the current organic polymer materials make the semiconductor devices more efficient, which results in the trend that organic polymer devices made from organic polymer materials are the mainstream of latest semiconductor devices development, and the semiconductor process technology applied to sensors is gradually guided to the organic polymer materials. However, the detecting elements made by semiconductor materials are susceptible to the influence of foreign impurities and ambient water and oxygen, which makes it difficult to increase the detecting sensitivity, particularly the light sensors made of organic polymer materials are greatly affected by foreign impurities and ambient water and oxygen.

Due to the aforesaid problems, this invention provides a sensing module and its manufacturing method, which can simplify the manufacturing process and form a hermetic chamber to isolate the environment and reduce the influence of environmental foreign impurities and ambient water and oxygen, and thus upgrade the accuracy of the sensors.

SUMMARY

The goal of this invention is to provide a structure of a sensing module and manufacturing method, which uses a first surface of the substrate to set the elements, and uses a second surface of the substrate to make a light source, so that the light from the light source penetrates the substrate and irradiates the colloid of the bonding element, or the light from the light source excites an optical conversion layer of the substrate and emits another light to irradiate the colloid, in the purpose of simplifying the manufacturing process and form a hermetic chamber to isolate the environment and reduce the influence of foreign impurities and ambient water and oxygen.

This invention discloses a method of manufacturing a sensing module, which provides a substrate for disposing or forming a sensor on the first surface of the substrate, and successively disposing at least one colloid on the first surface surrounding the sensor. Then, an optical conversion element is equipped on the first surface and the bottom is connected with the substrate through the colloid. Finally, a light source irradiates the colloid via a second surface of the substrate to solidify the colloid and produce a sensing module. This method can simplify the solidifying method of the colloid and irradiates the colloid more comprehensively, making the solidification of the colloid more complete.

This invention provides an embodiment in which the light source is a photo-curable light source, and at least one colloid is a photo-curable resin.

This invention provides an embodiment in which a material of the substrate is selected from a group of acrylic, glass, sapphire, and silicon; a material of the optical conversion element is selected from a group of silicon, germanium, and zinc sulfide.

This invention provides an embodiment in which an optical lens is further disposed on the optical conversion element, making the incident light of the sensing module is concentrated on the sensor.

This invention provides an embodiment in which in the step of disposing or forming a sensor on the first surface of the substrate, the sensor is electrically connected with a printed circuit on the substrate.

This invention further discloses a sensing module, which includes a substrate, a sensor, at least one colloid, and an optical conversion element, wherein the substrate has a printed circuit. The sensor is disposed on the first surface of the substrate and electrically connected with the printed circuit; at least one colloid is disposed on the first surface of the substrate and surrounds the sensor, and the optical conversion element is disposed on the first surface of the substrate. The surface is joined with at least one colloid by its lower edge, forming a hermetic chamber between the optical conversion element and the sensor.

This invention provides another embodiment, wherein at least one colloid is a photo-curable resin and solidified by a UV light, and a material of the substrate is selected from a group of acrylic, glass, sapphire, and silicon; a material of the optical conversion element are selected from a group of silicon, germanium, and zinc sulfide.

This invention provides another embodiment, which further includes an optical lens disposed on the first surface of the optical conversion element to guide the incident light and concentrate it on the sensor.

This invention provides another embodiment, wherein the optical lens is a Fresnel lens.

DETAILED DESCRIPTION

To enable the Review Committee members to have a deeper realization and understanding of the features and functions of this invention, we hereby put the embodiment and detailed explanation in below:

Some words are used to refer to specific elements in the descriptions and Claims. However, persons with general knowledge in the technical field of this invention should understand that the manufacturer may use different names to refer to the same element. Moreover, the descriptions and Claims do not use the name difference as a way to distinguish components but will take the differences in overall technology of components as the distinction criteria. "Including" mentioned in the entire Invention Description and the Claim items is an "open" term, it should be interpreted as "including but not limited to". Furthermore, the term "coupling" includes any direct and indirect means of connection. Therefore, if a first device is described to be coupled with a second device, it means that the first device can be directly connected with the second device or indirectly connected with the second device through other devices or other means of connection.

Because the conventional sensing module and its manufacturing method have time-varying noise in the input signal, the conventional sensors and manufacturing methods are susceptible to external impurities and ambient water and oxygen, which cause the sensing sensitivity unable to increase easily. Therefore, this invention proposes a sensing module and its manufacturing method to solve the problem of poor signal-to-noise ratio caused by conventional technologies.

Figure 1:
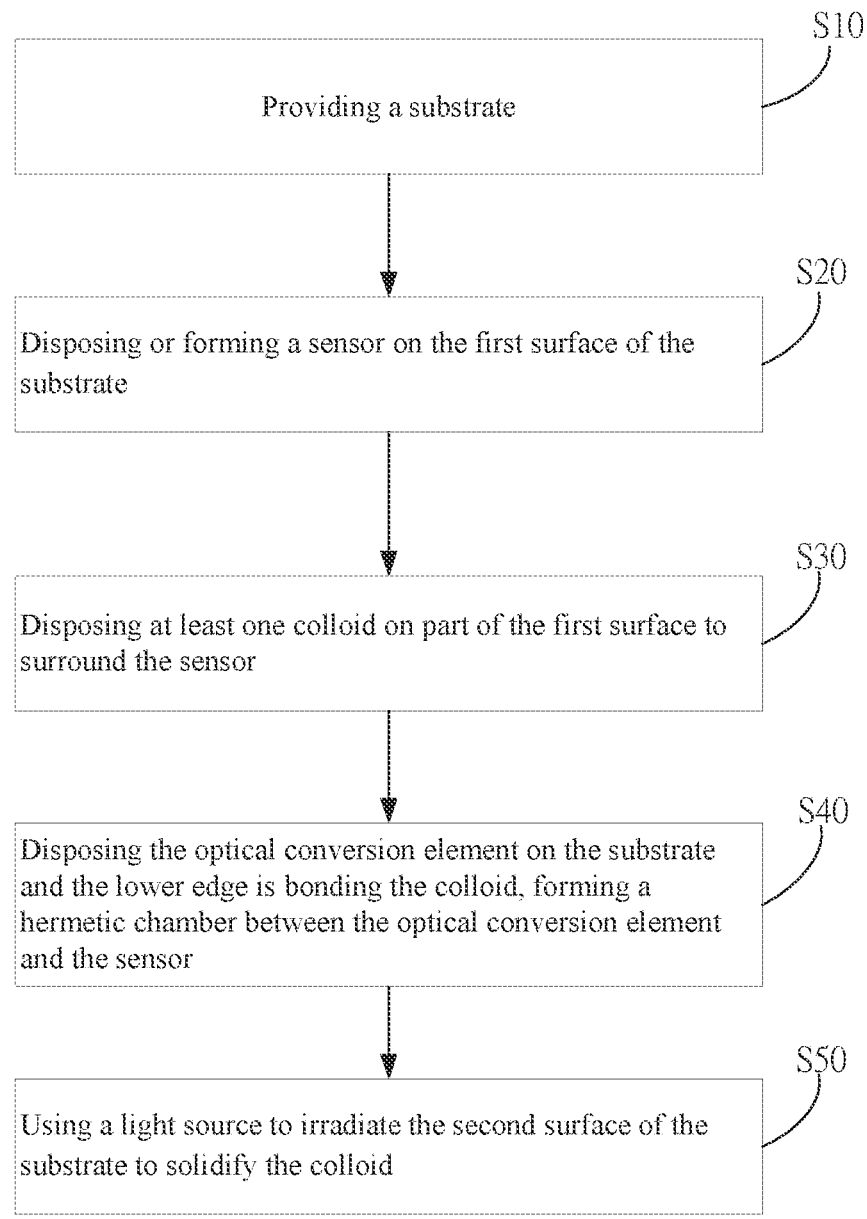
FIG. 1: which is an illustrated Flowchart in an embodiment of this invention.

In the following articles, we are going to further describe the features and the process structure of the sensor module and manufacturing method disclosed in this invention:

First, refer to FIG. 1, which is a flowchart of an embodiment of this invention. As shown in FIG. 1; the figure shows the method for manufacturing the sensor module in this invention.

Step S10: Providing a substrate;

Step S20: Disposing or forming a sensor on the first surface of the substrate;

Step S30: Disposing the colloid on the first surface of the substrate and surrounding the sensor;

Step S40: Disposing the optical conversion element on the substrate and the lower edge is bonding the colloid, forming a hermetic chamber between the optical conversion element and the sensor; and Step S50: Using a light source to irradiate the second surface of the substrate to solidify the colloid.

To have a clearer understanding of the method for manufacturing the sensing module stated in the aforesaid embodiment of this invention, further refer to FIG. 2A through FIG. 6, which are the schematic diagram of steps in an embodiment of this invention. As shown in these figures, the sensing module 10 of this invention includes a substrate 12, a sensor 14, at least one colloid 16, and an optical element 18. The optical element 18 includes an optical conversion element 182. The sensor 14, the at least one colloid 16, and the optical element 18 are all disposed on a first surface 122 of the substrate 12. Particularly in this embodiment, the substrate 12 is further provided with at least one conductive film 1222 electrically connected with the sensor 14, and further is used to connect with the external circuit.

Figure 2A:
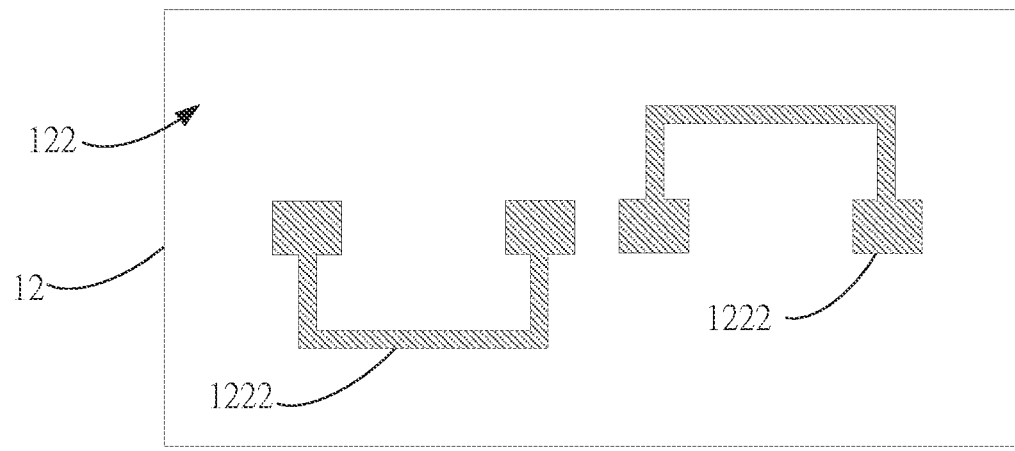
FIG. 2A and FIG. 2B: which are illustrated Schematic diagrams of steps in an embodiment of this invention.
Figure 2B:
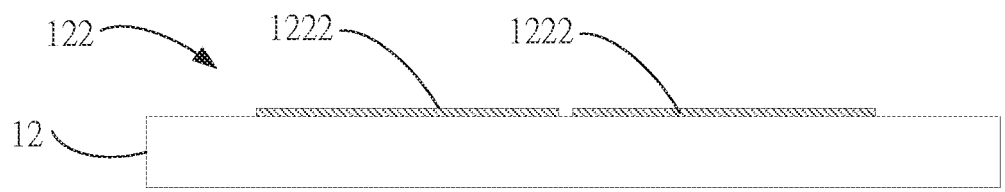
Figure 3A:
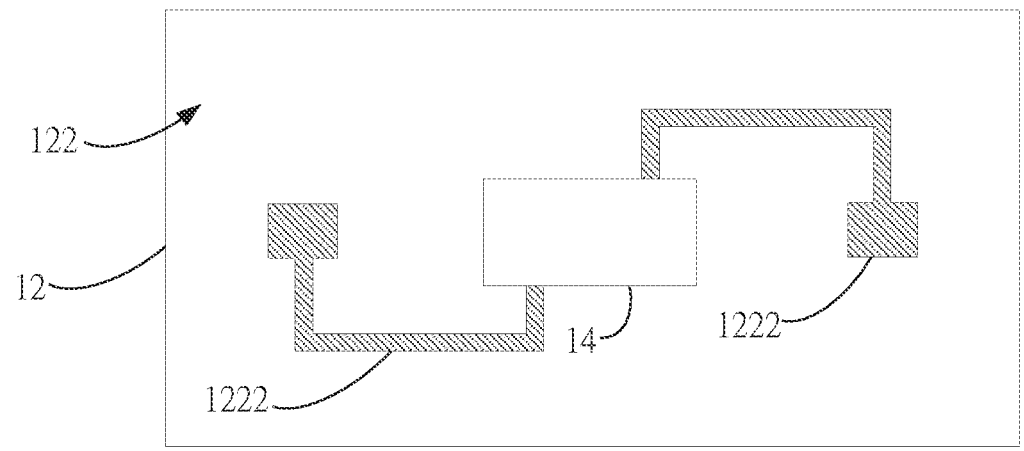
FIG. 3A and FIG. 3B: which are illustrated Schematic diagrams of steps in an embodiment of this invention.
Figure 3B:
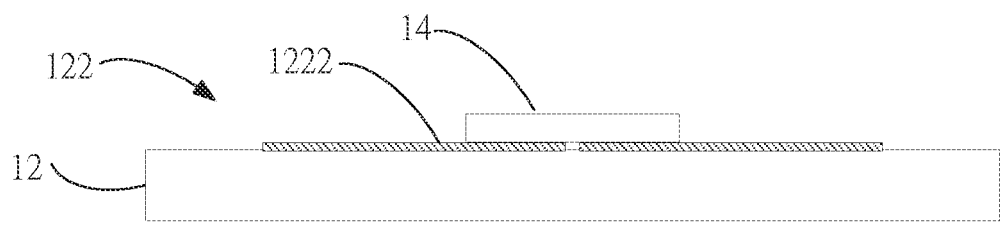

In step S10, also refer to FIG. 2A and FIG. 2B; a material of the substrate 12 are selected from a group of acrylic, glass, sapphire, and silicon, the substrate 12 is made by a sputter or a vacuum evaporation process to form the conductive film 1222 on a first surface 122 of the substrate 12. Therefore, step S10 of this embodiment provides a conductive substrate. In step S20, also refer to FIG. 3A and FIG. 3B, sensor 14 is disposed on the first surface 122 of the substrate 12, and sensor 14 is further disposed on the conductive film 1222, making sensor 14 is disposed on the conductive film 1222. Sensor 14 is electrically connected with the conductive film 1222. The sensor 14 of this invention can be a light sensor or vibration or magnetic sensor for an object, used for the sensing of the human body or IoT application. In this embodiment, a sensor product is disposed on substrate 12 as an example. In addition, in another embodiment, sensor 14 can be formed on the first surface 122 of the substrate 12 through a semiconductor process or a micro-electromechanical process. In step S30, also refer to FIG. 4A and FIG. 4B, it disposes of at least one colloid 16 on the first surface 122 of the substrate 12, particularly it disposes of at least one colloid 16 on part of the first surface 122.

Figure 4A:
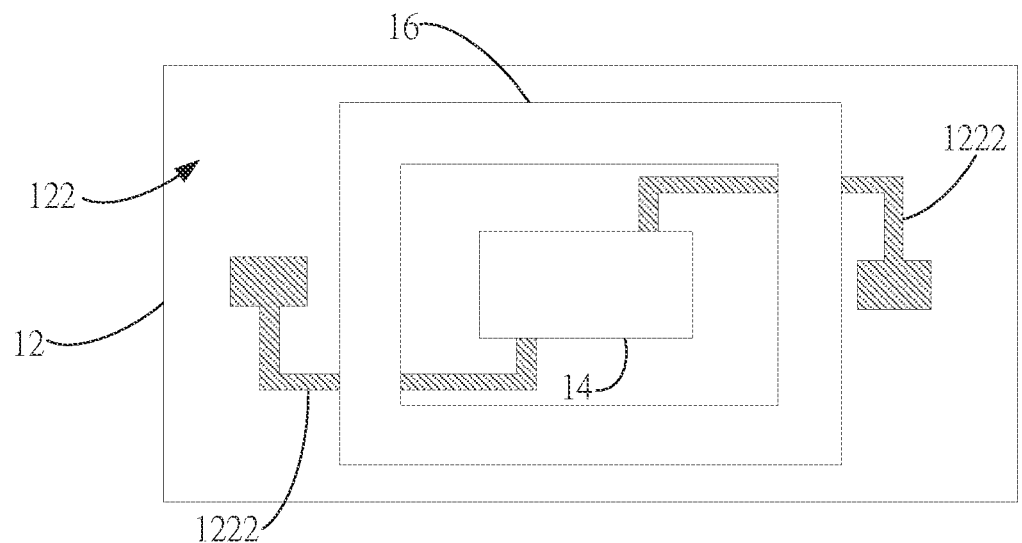
FIG. 4A and FIG. 4B: which are illustrated Schematic diagrams of steps in an embodiment of this invention.
Figure 4B:
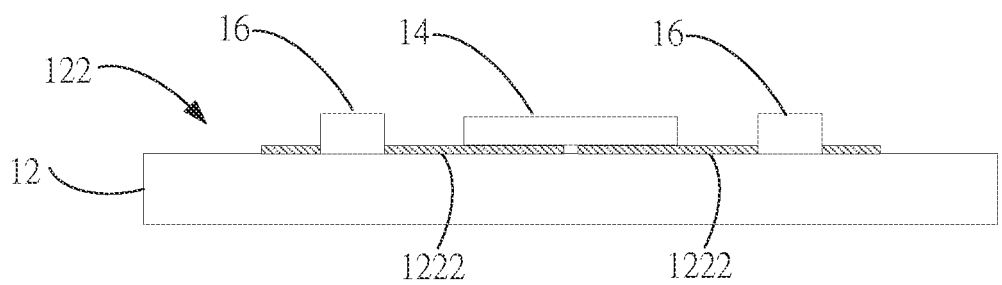

Continue to above, at least one colloid 16 is a photo-curable resin, the compound of the photo-curable resin can be divided into two types: the radical compound type and cationic compound type. The compound of the radical compound type photo-curable resin is selected from a group of acrylic and unsaturated polyester, and a compound of the cationic compound type photo-curable resin is selected from a group of epoxy, oxetane, and vinyl ether. Normally, the compound formula of photo-curable resin can be divided into three parts. The first part is the oligomer, which accounts for about 50% to 80% of the composition; normally, the properties of oligomer are low viscosity, odorless, excellent hardening property, and low toxicity. The second part is the photo-reactive monomer, which accounts for about 20% to 50% of the total; the required properties include: (1) with photo-reactivity, (2) with good hardening rate, (3) with good solvent power, and (4) low volatility. The third part is the photo-initiator, which accounts for about 1% to 10% of the total. The properties of the photo-initiator include: (1) it can attract light radiation energy and induce polymerization, (2) with good thermal stability; other cases can also add additives or even a small amount of solvents according to the needs of performances. Among them, except selected from a group of the free radical compound type photo-curable resin or the cat ion compound type photo-curable resin, the oligomer also can be selected from a group of acrylic ester or methacrylate ester, wherein the methacrylate includes benzyl acrylate, phenoxyethyl acrylate, nonylphenoxypolyethylene glycol acrylate, ethoxylated bisphenol A diacrylate, phenoxyethyl methacrylate, ethoxylated bisphenol A dimethacrylate, benzyl methacrylate, 1-phenylethyl methacrylate, 2-phenoxyethyl methacrylate, 2-phenylethyl methacrylate, 3-phenylpropyl methacrylate, 3-phenylpropyl acrylate, 2-phenoxyethyl acrylate and the combination of them. Refer to FIG. 4A and FIG. 4B, at least one colloid 16 surrounds sensor 14 and further crosses over the conductive film 1222.

Figure 5A:
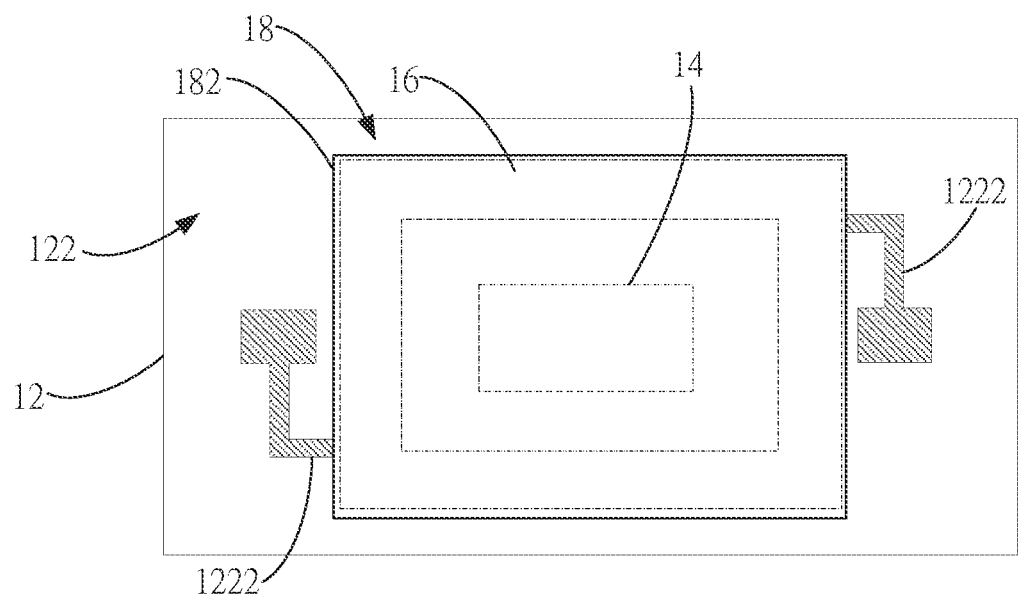
FIG. 5A and FIG. 5B: which are illustrated Schematic diagrams of steps in an embodiment of this invention.
Figure 5B:
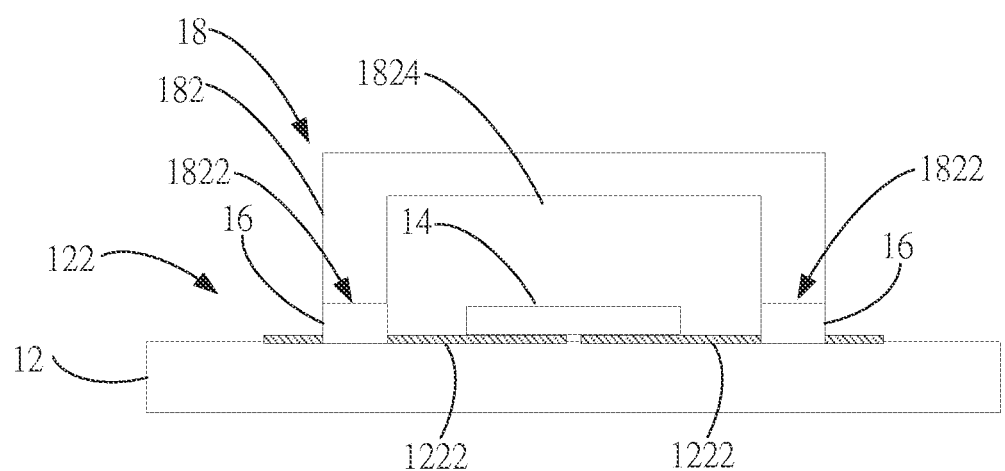

In step S40, also refer to FIG. 5A and FIG. 5B, the optical conversion element 182 is disposed on the first surface 122 of the substrate 12, and a lower edge 1822 of the optical conversion element 182 is bonded to the substrate 12 through at least one colloid 16, wherein the material of the optical conversion element is selected from a group of silicon, germanium, and zinc sulfide, particularly, a hermetic chamber 1824 is formed between the optical conversion element 182 and the substrate 12, and the hermetic chamber 1824 can be an air layer or a vacuum layer.

Figure 6:
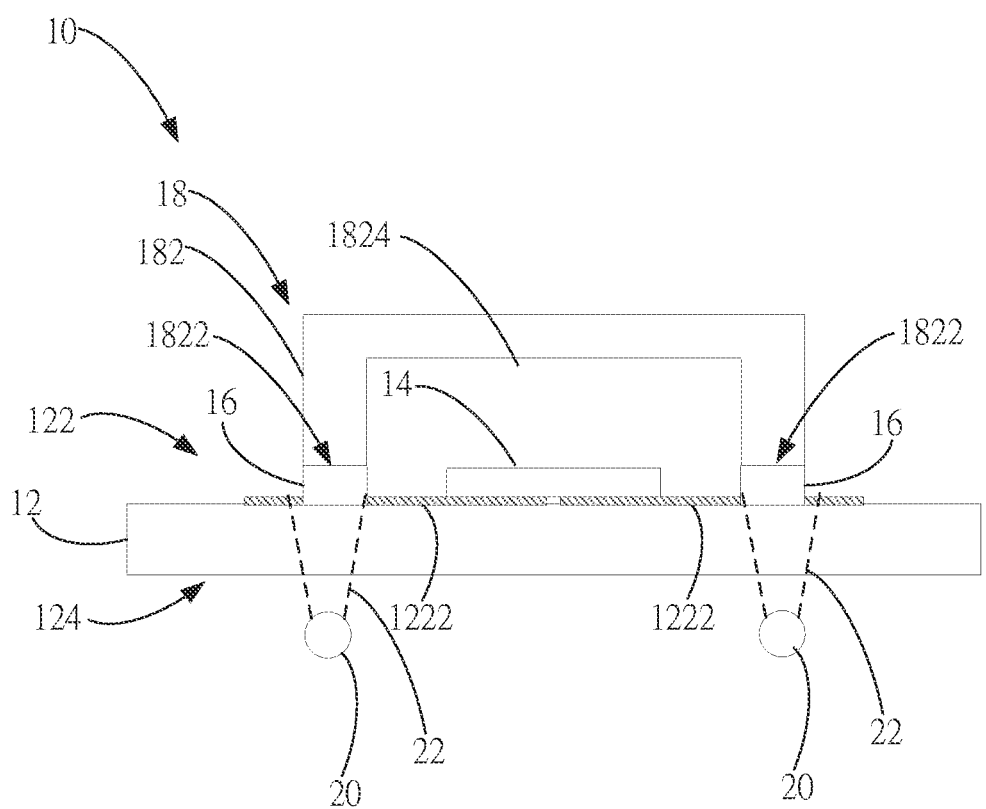
FIG. 6: which is an illustrated Schematic diagram of steps in an embodiment of this invention.

In step S50, also refer to FIG. 6, the light source 20 is used to emit a plurality of first light 22 and irradiate them to a second surface 124 of the substrate 12. The substrate 12 of this embodiment is light transparent, the first light 22 penetrates the substrate 12 to irradiate at least one colloid 16; from the photo-curable characteristics, the colloid 16 is solidified by the first light 22 and forms the solidified sensing module 10. The light source 20 of this invention is a photo-curable light source; in this embodiment, an UV light source is taken as an example. Therefore, the first light 22 corresponds to UV light rays. In addition, the photo-curable resin in this embodiment is a corresponding UV-curable resin, that is, the so-called UV colloid. From the above steps S10 to S50, the process efficiency in the sensor manufacturing process and the reliability of the sensor can be improved. Particularly, a lower edge 1822 of the optical conversion element 182 is bonded to the substrate 12 through at least one colloid 16 that further protects the sensor 14; that is, after the colloid 16 is solidified, it can pass through the hermetic chamber 1824 to isolate the environment and reduce the influence of environmental foreign impurities and ambient water and oxygen.

Figure 7:
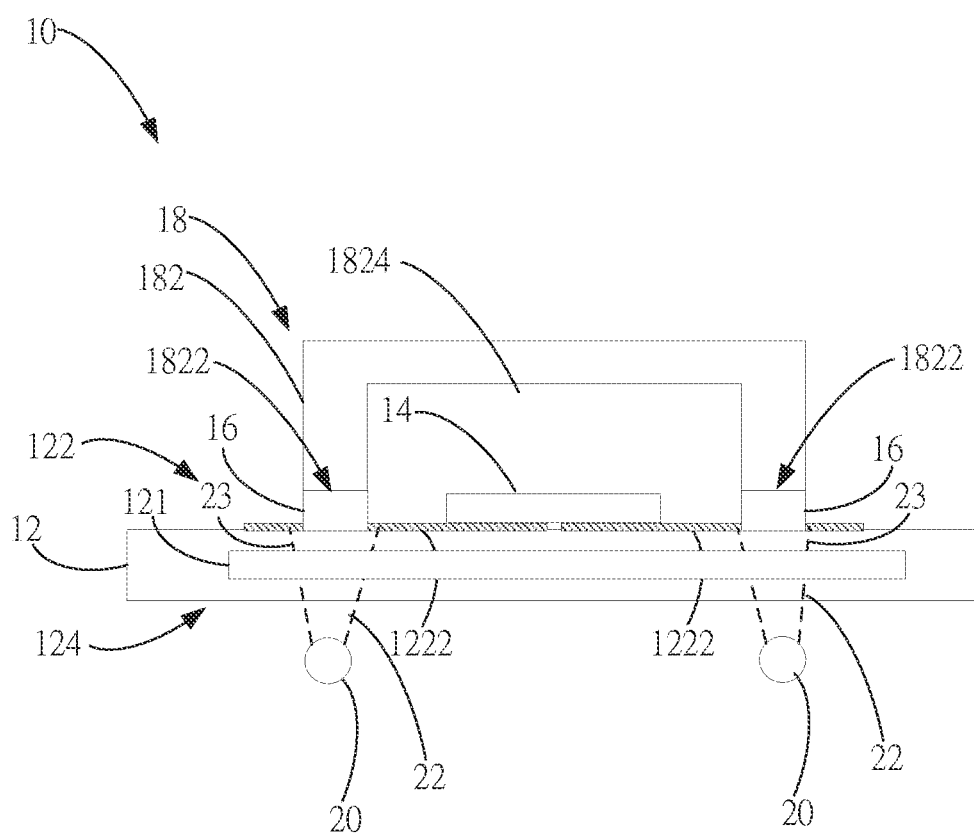
FIG. 7: which is an illustrated Schematic diagram of steps in another embodiment of this invention.

As shown in FIG. 7, it is a schematic diagram of the steps of another embodiment in this invention. As shown in the figure, substrate 12 of this invention can be further provided with a light conversion layer 121, which can convert the first light 22 into the second light 23 to further irradiate the colloid 16 by the second light 23. Correspondingly, colloid 16 is corresponding to the wavelength of the second light 23 for photo-solidification. After the colloid 16 is solidified, it can isolate the environment and reduce the influence of impurities and ambient water and oxygen of the external environment through the hermetic chamber 1824. The wavelength of the second light 23 in this embodiment is greater than the wavelength of the first light 22, so in this embodiment, the wavelength range corresponding to the colloid 16 is within the wavelength range from visible light to infrared light.

Figure 8:
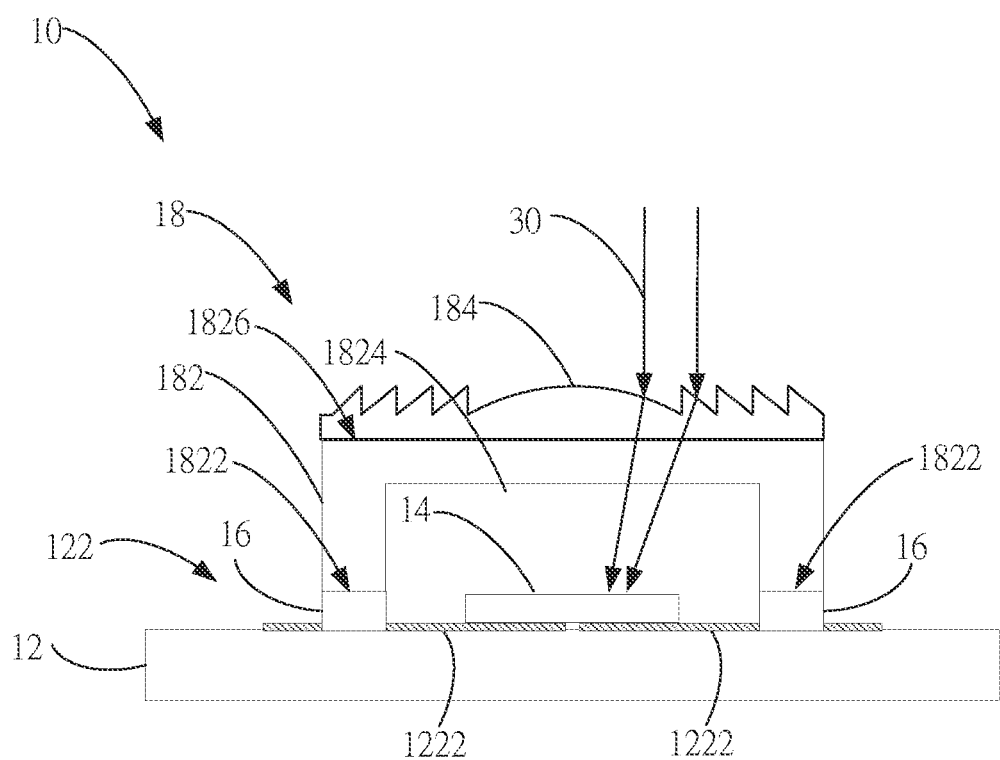
FIG. 8: which is an illustrated Schematic diagram of a structure in another embodiment of this invention.

As shown in FIG. 8, it is a schematic diagram of a structure in another embodiment of this invention. The difference between FIG. 8 and FIG. 5A is that the optical element 18 of FIG. 8 is further equipped with a second optical lens 184. The material of the second optical lens 184 can also be selected from a group of silicon, germanium, and zinc sulfide. The second optical lens 184 of this embodiment is disposed on an upper surface 1826 of the optical conversion element 182. The optical lens 184 concentrates and refracts a plurality of external incident lights 30; it concentrates the incident light 30 toward the sensor 14. Particularly, the colloid 16 is formed between the optical conversion element 182 and the substrate 12 of this invention. The hermetic chamber 1824 is more conducive to the transmission of the incident light 30 in the optical conversion element 182, particularly when the hermetic chamber 1824 is a vacuum layer, the detection sensitivity of the sensor 14 can be further improved.

Figure 9:
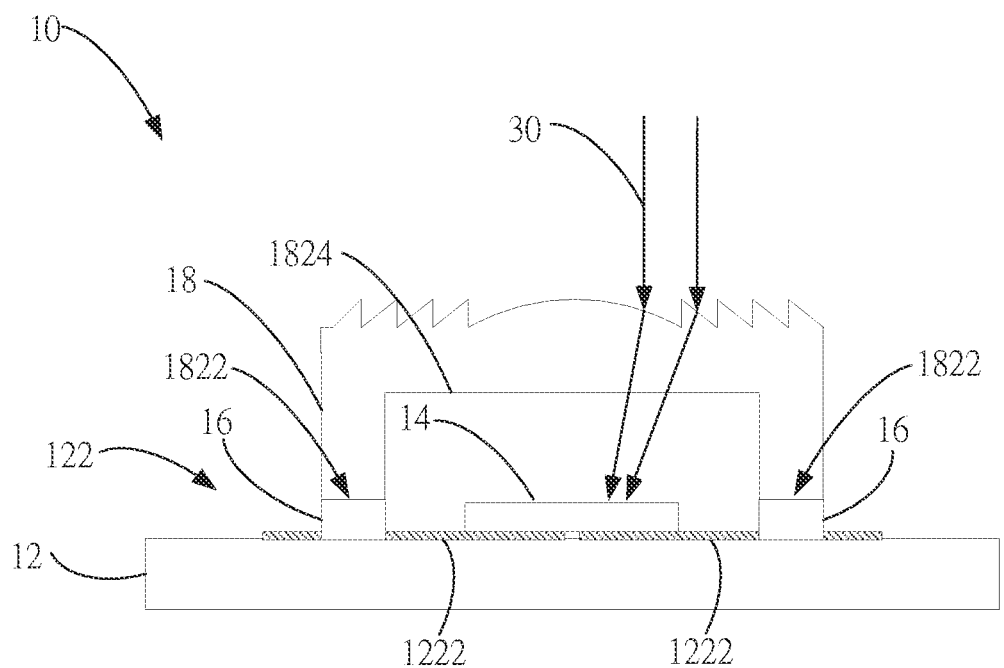
FIG. 9: which is an illustrated Schematic diagram of a structure in another embodiment of this invention.

As shown in FIG. 9, it is a schematic diagram of a structure in another embodiment of this invention. The difference between FIG. 8 and FIG. 9 is that the optical element 18 in FIG. 8 is divided into the optical conversion element 182 and the second optical lens 184. In FIG. 9 they are integrated into the optical element 18, that is, the optical conversion element 182 and the second optical lens 184 are integrated to reduce the interface and avoid the full reflection occurred in optical element 18. The aforesaid optical conversion element 182 and second optical lens 184 of this invention can be joined together by another colloid with the composition identical to the colloid 16.

In the above embodiment, the optical element 18 or the optical conversion element 182 of this invention isolates foreign impurities from ambient water and oxygen and therefore can improve the sensing sensitivity. The optical conversion element 182 can be used to further filter the incident wavelength of the light 30 corresponds to the sensing wavelength range of the sensor 14, and the irradiation range of the incident light 30 can be further concentrated on the sensor 14; that is, it further has the functions of a filter and a lens. Infrared (IR) is an electromagnetic wave with a wavelength between microwave and visible light. Its wavelength is between 760 nanometers (nm) and 1 millimeter (mm). It is an invisible light with a longer wavelength than red light. The frequency of IR is approximately in the range of 430 THz to 300 GHz.

Moreover, the light sensor 14 of this invention can be an infrared sensor, which can be applied to 1: Near Infrared (NIR) imaging applications according to the sensing wavelength range; and the wavelength range is from 700 nm to 900 nm. Using adding the emulsion with special dyes to produce a photochemical reaction, it converts the photo change in this wavelength range into a chemical change and forms an image, or it can be used in 2: NIR electronic photosensitive application, the wavelength range is from 700 nm to 2,000 nm, using the silicon-based compound crystals to produce a photoelectric reaction and form electronic images. Even for the far-infrared (FIR) electronic photosensitive applications, wherein the wavelength range is from 3000 nm to 4000 nm and from 8000 nm to 14000 nm, in particular, the present human infrared sensing is applied within the range from 8000 nm to 14000 nm. Therefore, the optical conversion element 182 further has a wavelength filtering function, which can filter the wavelength of the incident light 30 into a wavelength within the sensing wavelength range corresponding to the sensor 14. Sensor 14 can be a matrix light sensor, making the conductive film 1222 present multiple contacts. The infrared sensor can increase the sensing sensitivity under a vacuum. Therefore, when sensor 14 of this invention is an infrared sensor and the hermetic chamber 1824 is a vacuum layer, the sensing sensitivity of sensor 14 will be improved.

However, the above are only preferred embodiments of this invention and are not used to limit the scope of implementation of this invention. For example, all shapes, structures, features, and spirits described in the scope of the patent application of this invention are equal changes and modifications shall be included in the scope of the patent application of this invention.

The invention claimed is:

1. A method for manufacturing a sensing module, comprising:

providing a substrate;

disposing or forming a sensor on a first surface of the substrate;

disposing at least one colloid on the first surface to surround the sensor;

disposing an optical conversion element on the substrate and bonding at least one colloid with a lower edge of the optical conversion element, forming a hermetic chamber between the optical conversion element and the substrate; and using a light source to irradiate a second surface of the substrate, making a plurality of light rays of the light source penetrates the substrate to irradiate and solidify the at least one colloid;

wherein a material of the substrate is selected from a group of acrylic, glass, sapphire, and silicon; the material of optical conversion element is selected from a group of silicon, germanium and zinc sulfide.

2. The method for manufacturing sensing module of claim 1, in which the light source is a light source for light curing, the at least one colloid is a light cured resin.

3. The method for manufacturing sensing module of claim 2, wherein a compound of the radical compound type photo-curable resin is selected from a group of acrylic, and unsaturated polyester, or is selected from a group of epoxy, oxetane and vinyl ether.

4. The method for manufacturing sensing module of claim 1, in which in the step of disposing or forming a sensor on the first surface of the substrate, the sensor is further formed on the first surface of the substrate by a semiconductor process or a micro-electromechanical process.

5. The method for manufacturing the sensing module of claim 1, further includes:

disposing an optical lens on the optical conversion element, making the incident light of the sensing module is concentrated on the sensor.

6. The method for manufacturing the sensing module of claim 1, wherein in the step of disposing or forming a sensor on the first surface of the substrate, the sensor is electrically connected with a printed circuit on the substrate.

7. A sensing module, which includes:

a substrate, disposing a printed circuit thereon, wherein a material of the substrate is selected from a group of acrylic, glass, sapphire and silicon; a material of optical conversion element is selected from a group of silicon, germanium and zinc sulfide;

a sensor, disposed on a first surface of the substrate, and electrically connected with the printed circuit;

at least one colloid, disposed on the first surface of the substrate to surround the sensor; and an optical conversion element, disposed on the first surface of the substrate and bonded with the at least one colloid with a lower edge thereof to form a hermetic chamber between the optical conversion element and the substrate.

8. The sensing module of claim 7, wherein the at least one colloid is a light cured resin.

9. The sensing module of claim 7, further including:

an optical lens, disposed on the first surface of the optical conversion element to guide the incident light and concentrate it on the sensor.

10. The sensing module of claim 9, wherein the optical lens is a fresnel lens.

* * * * *